(12) United States Patent
Parthasarathy et al.

(10) Patent No.: US 8,422,187 B2
(45) Date of Patent: Apr. 16, 2013

(54) APPARATUS AND METHOD FOR ELECTRONIC CIRCUIT PROTECTION

(75) Inventors: Srivatsan Parthasarathy, Woburn, MA (US); Javier A Salcedo, North Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 381 days.

(21) Appl. No.: 12/830,098

(22) Filed: Jul. 2, 2010

(65) Prior Publication Data

US 2012/0002337 A1 Jan. 5, 2012

(51) Int. Cl.
*H02H 3/22* (2006.01)
(52) U.S. Cl.
USPC ............................ 361/111; 361/56; 361/91.1
(58) Field of Classification Search .................. None
See application file for complete search history.

(56) References Cited

U.S. PATENT DOCUMENTS

| | | | |
|---|---|---|---|
| 5,748,425 A * | 5/1998 | Gutsch et al. .................. 361/56 |
| 5,835,328 A | 11/1998 | Maloney et al. |
| 6,429,489 B1 | 8/2002 | Botula et al. |
| 6,442,008 B1 * | 8/2002 | Anderson ....................... 361/56 |
| 7,064,393 B2 | 6/2006 | Mergens et al. |
| 7,102,862 B1 | 9/2006 | Lien et al. |
| 7,738,222 B2 | 6/2010 | Deutschmann et al. |
| 2002/0153571 A1 | 10/2002 | Mergens et al. |
| 2004/0114288 A1 | 6/2004 | Cheng et al. |
| 2006/0103998 A1 | 5/2006 | Smith |
| 2007/0076338 A1 | 4/2007 | Traynor et al. |
| 2008/0304191 A1 | 12/2008 | Riviere et al. |
| 2008/0316659 A1 * | 12/2008 | Oguzman et al. ............... 361/56 |
| 2010/0214706 A1 * | 8/2010 | Crespo et al. .................. 361/56 |
| 2011/0235228 A1 | 9/2011 | Salcedo et al. |

FOREIGN PATENT DOCUMENTS

WO WO 2009/050641 4/2009

OTHER PUBLICATIONS

Search Report and Written Opinion in PCT/US2011/041267 dated Nov. 7, 2011.
Salcedo et al., *Electrostatic Discharge Protection Framework for Mixed-Signal High Voltage CMOS Applications*, IEEE Xplore, downloaded Feb. 23, 2010 at 12:53 EST, 4 pages.

* cited by examiner

*Primary Examiner* — Jared Fureman
*Assistant Examiner* — Terrence Willoughby
(74) *Attorney, Agent, or Firm* — Knobbe, Martens, Olson & Bear, LLP (57) ABSTRACT

Apparatuses and methods for providing transient electrical event protection are disclosed. In one embodiment, an apparatus comprises a detection and timing circuit, a current amplification circuit, and a clamping circuit. The detection and timing circuit is configured to detect a presence or absence of a transient electrical event at a first node, and to generate a first current for a first duration upon detection of the transient electrical event. The current amplification circuit is configured to receive the first current from the detection and timing circuit and to amplify the first current to generate a second current. The clamping circuit is electrically connected between the first node and a second node and receives the second current for activation. The clamping circuit is configured to activate a low impedance path between the first and second nodes in response to the second current, and to otherwise deactivate the low impedance path.

26 Claims, 10 Drawing Sheets

APPARATUS AND METHOD FOR ELECTRONIC CIRCUIT PROTECTION

BACKGROUND

1. Field

Embodiments of the invention relate to electronic systems, and more particularly, to transient electrical event protection circuits.

2. Description of the Related Technology

Certain electronic systems can be exposed to a transient electrical event, or an electrical signal of short duration having rapidly changing voltage and high power. Transient electrical events can include, for example, electro static discharge (ESD) events arising from the abrupt release of charge from an object or person to an electronic system.

Transient electrical events can destroy integrated circuits (ICs) due to overvoltage conditions and high levels of power dissipation in relatively small areas of the ICs. High power dissipation can increase IC temperature, and can lead to numerous problems, such as gate oxide punch-through, junction damage, metal damage, and surface charge accumulation. Transient electrical events can be a problem in a variety of applications, including, for example, in high performance radio frequency (RF) circuit applications. Thus, there is a need for providing protection over ICs in an electronic system from such transient electrical events.

SUMMARY

In one embodiment, an apparatus for providing transient electrical event protection is disclosed. The apparatus comprises a detection and timing circuit configured to detect a presence or absence of a transient electrical event at a first node, and to generate a first current for a first duration upon detection of the transient electrical event. The apparatus further comprises a current amplification circuit configured to receive the first current from the detection and timing circuit and to amplify the first current to generate a second current. The apparatus further comprises a clamping circuit electrically connected between the first node and a second node and configured to receive the second current for activation. The clamping circuit is configured to activate a low impedance path between the first and second nodes in response to the second current, and to otherwise deactivate the low impedance path.

In another embodiment, an apparatus for providing transient electrical event protection is disclosed. The apparatus comprises means for detecting a presence or absence of a transient electrical event at a first node and for generating a first current for a first duration upon detection of the transient electrical event. The apparatus further comprises means for amplifying the first current to generate a second current, and means for activating a low impedance path between the first node and a second node in response to the second current, wherein the low impedance path is otherwise deactivated.

In another embodiment, a method is provided for transient electrical event protection. The method comprises detecting the presence of a transient electrical event at a first node, generating a first current for a first duration in response to the transient electrical event, and amplifying the first current to generate a second current. The method further comprises activating a low impedance path between the first node and a second node for a current in response to the second current using a bipolar transistor, and otherwise deactivating the low impedance path between the first and second nodes. Detecting, amplifying, and providing are performed by separate circuits within an integrated circuit, and providing a low impedance path between the first and second nodes is performed before a junction breakdown of the bipolar transistor.

DETAILED DESCRIPTION OF EMBODIMENTS

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Certain electronic systems are configured to protect circuits or components therein from transient electrical events. Furthermore, to help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient electrical events, including ESD events.

An IC typically includes one or more pads which provide electrical connection between internal circuits of the IC and external devices or circuits (for example, a printed circuit board, a power supply, and voltage references). The reliability of such internal circuits can be improved by providing pad protection circuits to the pads of an IC. Such a pad protection circuit can also be generally referred to as an "IC protection circuit" in this document. The pad protection circuits can maintain the voltage level at the pad within a predefined safe range, and can be configured to transition from a high-impedance state to a low-impedance state when a transient electrical event is detected. Thereafter, the pad protection circuit can be configured to remain in the low-impedance state for a preselected duration of time.

In one embodiment, pad protection circuits can have relatively fast turn-on times and can be configured to enter a low-impedance state at a relatively low voltage without relying on direct junction breakdown. This can enhance protection against transient electrical events relative to a circuit in which a protection circuit clamps at a junction breakdown voltage, which may result in the transient electrical event reaching a voltage level higher than the breakdown voltage of devices internal to the IC.

There is a need for improved actively-controlled protection circuits which can be configured to provide transient electrical event protection under preselected conditions in a controlled manner, and which have enhanced stability and robustness against false activation. Furthermore, there is a need for a protection circuit that can detect transient electrical events without relying on direct junction breakdown to provide voltage clamping. Moreover, there is a need for a protection circuit having a relatively fast activation time, relatively low static power dissipation, and a relatively small area for low cost in, for example, radio frequency (RF) applications.

Overview of Electronic Systems

Figure 1:
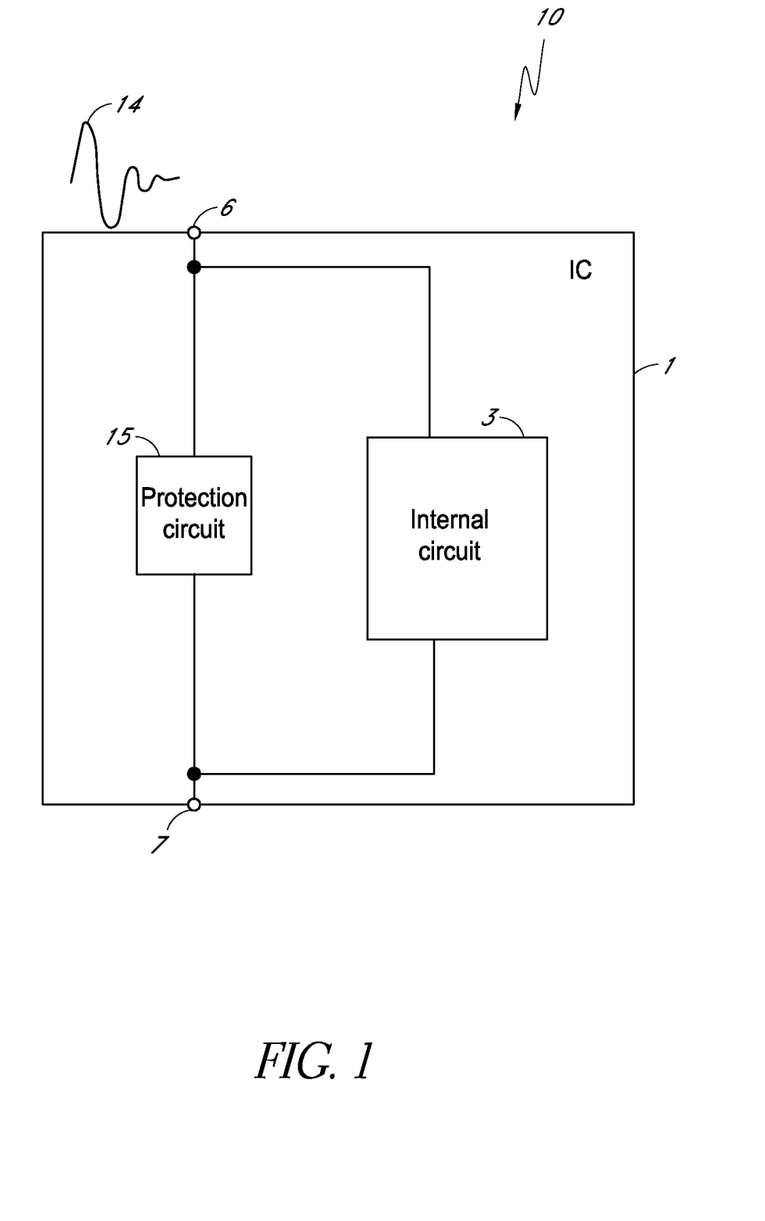
FIG. 1 is a schematic block diagram of an electronic system in accordance with one embodiment.

FIG. 1 is a schematic block diagram of an electronic system 10, which can include one or more pad protection circuits according to some embodiments. The illustrated electronic system 10 includes an integrated circuit (IC) 1 that includes a protection circuit 15, an internal circuit 3, and pins or pads 6, 7. The internal circuit 3 can include one or more circuits of various functionalities, and can be electrically connected to one or more of the pads 6, 7. Each of the pads 6, 7 can be used for data communication and/or power supply, and can be, for example, one of power pads, ground pads, or bidirectional pads.

The IC 1 can be exposed to transient electrical events, such as ESD events, which can cause IC damage and induce latch-up. For example, the pad 6 can receive a transient electrical event 14, which can travel along electrical connections of the IC 1 and reach the internal circuit 3. The transient electrical event 14 can produce overvoltage conditions and can dissipate high levels of power, which can disrupt the functioning of the internal circuit 3 and potentially cause permanent damage.

A pad protection circuit 15 can be provided to ensure reliability of the IC 1. The pad protection circuit 15 can be configured to detect a transient electrical event received on a pad of the IC 1, and to shunt a current associated with the transient electrical event to other nodes or pads of the IC 1, thereby providing transient electrical event protection, as will be described in further detail below.

The pad protection circuit 15 can be placed between a power pad and a ground pad. Additionally, in certain embodiments, the pad protection circuit 15 can be placed in other configurations, including, for example, between a power pad and an input pad, between a power pad and an output pad, between a power pad and a bidirectional pad, between a ground pad and an input pad, between a ground pad and an output pad, and/or between a ground pad and a bidirectional pad. When no transient electrical event is present, the pad protection circuit can remain in a high-impedance/low-leakage state, thereby minimizing static power dissipation resulting from leakage current.

The pad protection circuit 15 can be integrated on-chip with the IC 1. However, in other embodiments, the pad protection circuit 15 can be arranged in a separate IC. For example, the pad protection circuit 15 can be included in a separately packaged IC, or it can be encapsulated in a common package with the IC 1. In such embodiments, one or more pad protection circuits can be placed in a stand-alone IC, in a common package for system-on-a-package applications, or integrated with an IC in a common semiconductor substrate for system-on-a-chip applications.

The IC 1 can be used in, for example, high speed radio frequency (RF) systems, transmission line systems, industrial control, power management systems, microelectromechanical system (MEMS) sensors, transducers, or a variety of other systems. The IC 1 can be utilized in electronic systems in which the pins of the IC are exposed, for example, to IC assembly conditions that generate field-induced discharges, mechanical conductive tools for handling and testing, and/or direct user contact through a low-impedance connection.

Pad Protection Circuits

Figure 2:
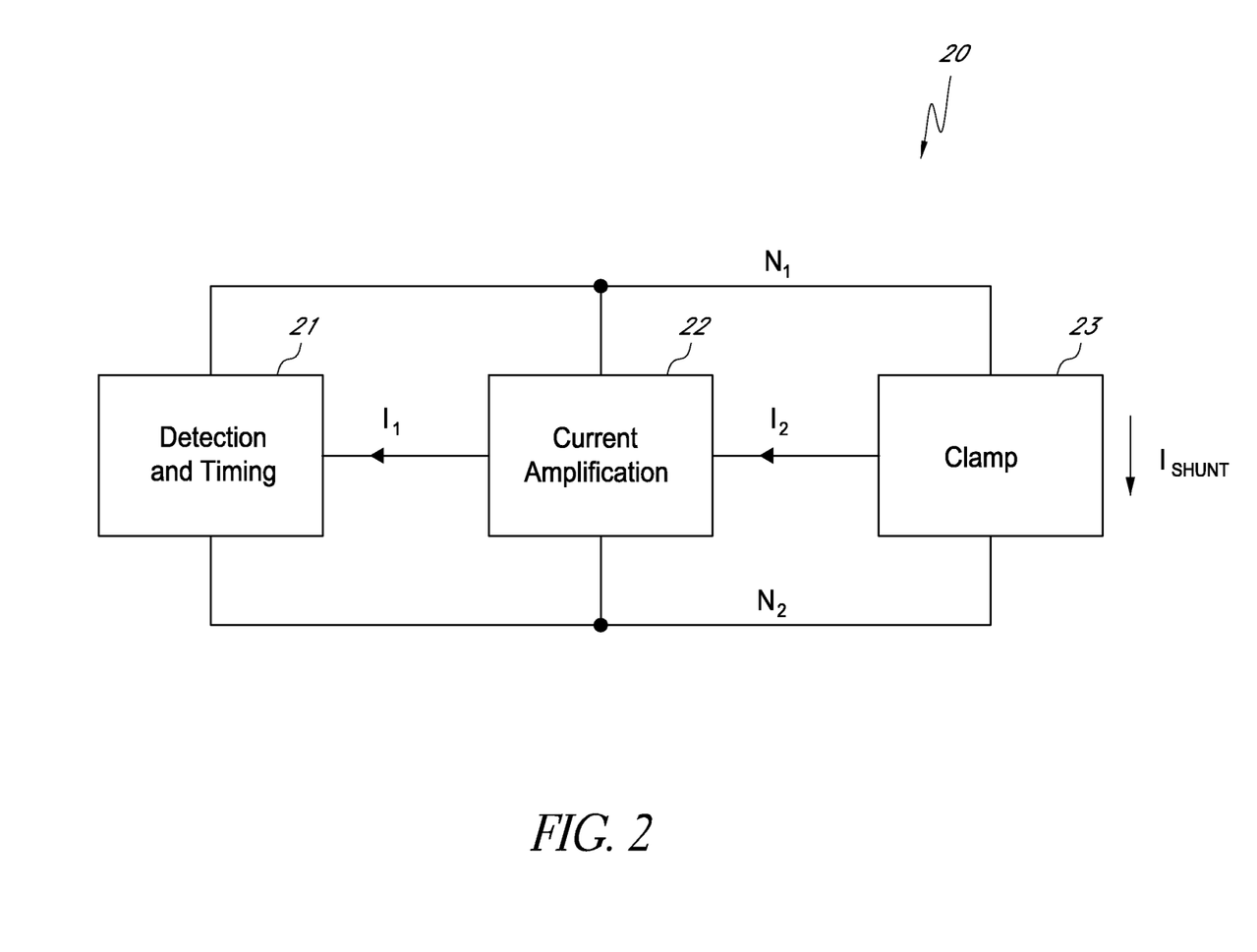
FIG. 2 is a schematic block diagram illustrating an actively-controlled protection circuit in accordance with embodiments.

FIG. 2 is a schematic block diagram illustrating an actively-controlled protection circuit 20 in accordance with some embodiments. The illustrated protection circuit 20 includes a detection and timing block 21, a current amplification block 22, and a clamp block 23. The detection and timing block 21 can be configured to provide a current $I_1$ to the current amplification block 22 in response to a transient electrical event. As will be described in detail below, the detection and timing block 21 can generate the current $I_1$ after detecting a transient electrical event, and the current $I_1$ can remain active for a predetermined time, for example, a time ranging between about 40 nanoseconds (ns) to about 350 ns. The current $I_1$ can be received by the current amplification block 22, which can amplify the current $I_1$ to generate a current $I_2$. The current $I_2$ can be provided to the clamp block 23, and can be used to turn-on the clamp block 23 into a low-impedance state in which the clamp block 23 limits the maximum voltage conditions while providing a low impedance path to discharge a current $I_{SHUNT}$, as will be described in detail below.

The protection circuit 20 also includes a first node $N_1$ and a second node $N_2$, which can be electrically connected to one or more of the detection and timing block 21, the current amplification block 22, the clamp block 23, and additional blocks not shown. Although the detection and timing block 21, the current amplification block 22, and the clamp block 23 are shown as each connected to first and second nodes $N_1$, $N_2$, in certain embodiments, not all of the illustrated connections are necessary.

As will be described in detail below, the clamp block 23 of the protection circuit 20 can be configured to begin in a low-leakage/high-impedance state (or OFF state). The OFF state impedance can be in, for example, the range of about 300 GΩ to about 600 GΩ, thereby minimizing power consumption. Upon detection of a transient electrical event satisfying one or more signaling conditions, such as a particular rate of voltage change, the detection and timing block 21 can be configured to provide a current $I_1$ to the current amplification block 22 for a particular duration of time. The current amplification block 22 can be configured to amplify the current $I_1$ to generate a current $I_2$, which can turn-on the clamp block 23 into a high-current/low-impedance state (or ON state), in which the clamp block 23 discharges a current $I_{SHUNT}$. The shunt current $I_{SHUNT}$ can be, for example, in the range of about 600 mA to about 3 A, thereby aiding in protecting an IC from a transient electrical event. The clamp block 23 can remain in the low-impedance state for a duration determined by the detection and timing block 21 as indicated above, and thereafter the clamp block 23 can return to the low-leakage/high-impedance state.

The detection and timing block 21 can be configured to detect a transient electrical event on the first node $N_1$ and/or second node $N_2$, and to generate a current $I_1$ indicative of whether or not a qualifying transient electrical event has been detected. For example, the detection and timing block 21 can be configured to generate the current $I_1$ when the detection and timing block 20 detects a rapidly changing voltage for a sufficient period of time on the first node $N_1$ and/or second node $N_2$. For example, the detection and timing block 21 can be configured to activate for transient electrical signals having a rate of current change in the range of about 10 mA/ns to about 1 A/ns for a length of time in the range of about 2 ns to about 500 ns. The detection and timing block 21 can be configured to remain in the high-impedance state over normal variation in the voltages first node $N_1$ and the second node $N_2$, including, for example, signaling conditions associated with inserting an IC into a live socket.

Persons of ordinary skill in the art will appreciate that the detection and timing block 21 can be configured to monitor a transient electrical event based on a multitude of detection conditions indicative of a transient electrical event's potential to damage sensitive electronics, including but not limited to, measurements of power, voltage, and/or charge. The detection and timing block 21 can be configured to generate a current $I_1$ for a time period associated with a typical stress time of a transient electrical event, for example, a time ranging between about 40 ns to about 350 ns. One embodiment of the detection and timing block 21 will be described below with reference to FIG. 3.

As described above, it can be desirable for the impedance of the protection circuit 20 to change by several orders of magnitude over a short amount of time. Thus, it can be desirable for the clamp block 23 to transition between the high-impedance state and the low impedance state in a short amount of time, for example, between about 0.1 ps and about 100 ps, and at a voltage less than that associated with over-voltage conditions, junction breakdown of internal devices, or damage to an IC. As will be described below with reference to FIGS. 3-5C, the clamp block 23 can be configured to begin in the low-leakage/high-impedance state. After detection of a transient electrical event satisfying a signaling condition, the clamp block 23 can receive the current $I_1$. Thereafter, the clamp block 23 can amplify the current $I_2$ to allow the discharge of a current $I_{SHUNT}$ and provide protection from a transient electrical overstress event. Although the currents $I_1$ and $I_2$ are shown as having a particular polarity, in certain embodiments, the polarity of each current can be reversed.

Figure 3:
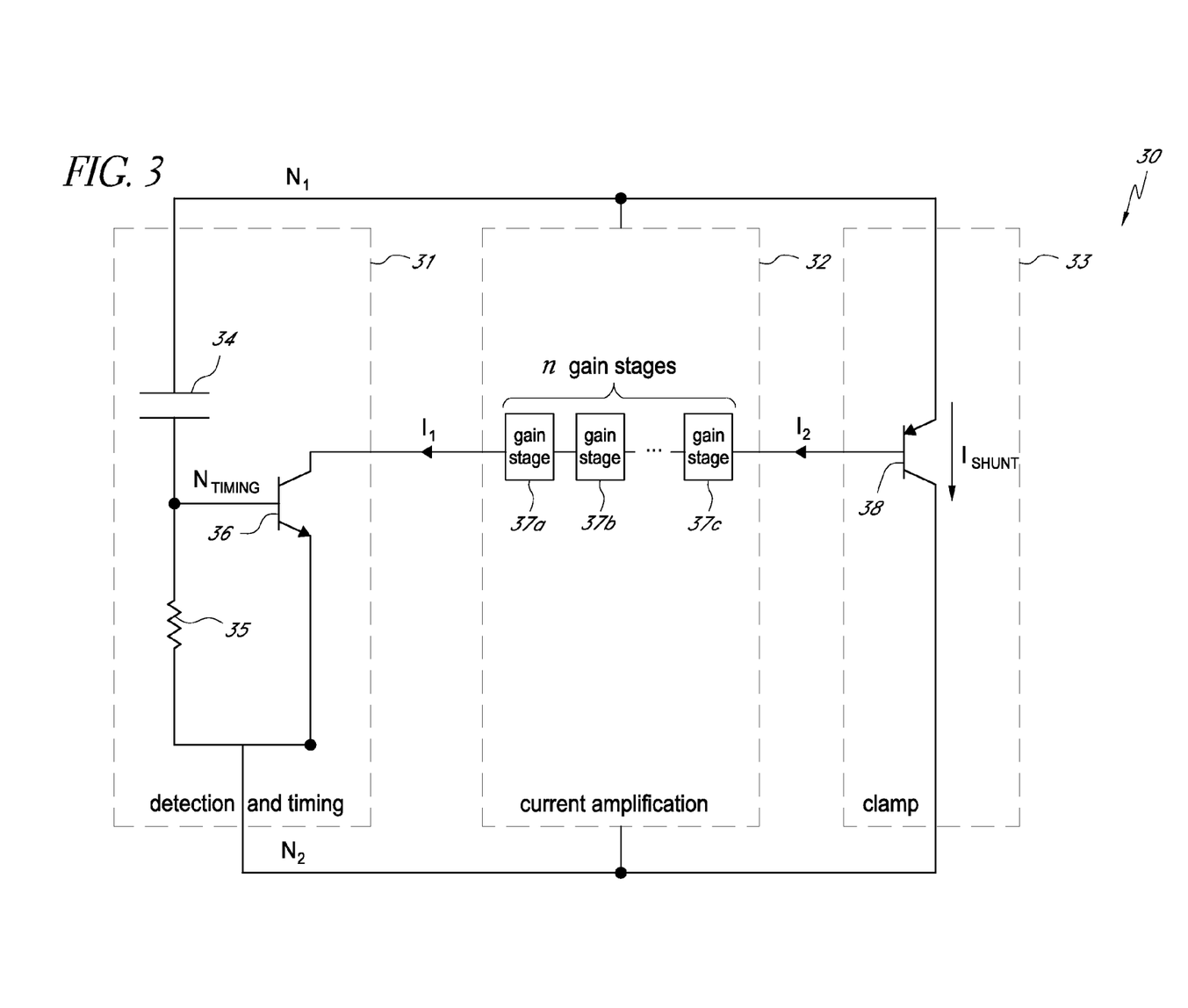
FIG. 3 is a circuit diagram illustrating an actively-controlled protection circuit in accordance with one embodiment.

FIG. 3 is a circuit diagram illustrating an actively-controlled protection circuit 30 in accordance with one embodiment. The illustrated protection circuit 30 includes a detection and timing block 31, a current amplification block 32, and a clamp block 33, each electrically connected between first and second nodes $N_1$ and $N_2$. The detection and timing block 31 can generate a current $I_1$, which can be received by the current amplification block 32. The current amplification block 32 can amplify the current $I_1$ to produce a current $I_2$, which can be used by the clamp block 33 to generate a low-impedance path between the first and second nodes $N_1$ and $N_2$.

The illustrated detection and timing block 31 includes a capacitor 34, a resistor 35, and an NPN bipolar transistor 36 having an emitter, a base and a collector. The capacitor 34 includes a first terminal electrically connected to the node $N_1$, and a second terminal electrically connected to the base of the NPN bipolar transistor 36 and to a first end of the resistor 35 at a node labeled $N_{TIMING}$. The resistor 35 further includes a second end electrically connected to the emitter of the NPN bipolar transistor 36 at the node $N_2$. The emitter of the NPN bipolar transistor 36 is electrically connected to the node $N_2$, and the collector of the NPN bipolar transistor 36 can be configured to generate the current $I_1$.

The detection and timing block 31 can be configured to generate the current $I_1$ in response to a transient electrical event having a particular rate of voltage change. For example, the first node $N_1$ can begin at a voltage level substantially equal to the voltage of the second node $N_2$. When the first node $N_1$ experiences a sudden increase in voltage, the coupling provided by the capacitor 34 can raise the voltage on the node $N_{TRIGGER}$. As the rate of change (dV/dt) of the first node $N_1$ increases, the current injected by the capacitor 34 can be about $I_C = C * dV/dt$. When the first node $N_1$ experiences a rate of change of voltage of a certain magnitude for a sufficient duration, the current through the resistor 35 can create a voltage, which forward biases the base-emitter junction of the NPN bipolar transistor 36. Thereafter, a current $I_1$ can be generated, which can charge the capacitor 34, and return the voltage of the node $N_{TIMING}$ to a voltage equal to about the voltage of the node $N_2$. The resistance of the resistor 35 can be selected such that the time it takes to charge the capacitor 34 can be substantially determined by the capacitance of the capacitor 34 and the magnitude of the current $I_1$, while functioning to bias the node $N_{TIMING}$ at a voltage equal to about the voltage of the second node $N_2$ under DC conditions.

In one embodiment, the capacitance of the capacitor 34 is selected to be in the range of about 1.5 pF to about 3.5 pF, and the resistor 35 is selected to be in the range of about 30 kΩ to about 50 kΩ. The NPN bipolar transistor 36 can be sized so as to determine the magnitude of the current $I_1$. In one embodiment, the NPN bipolar transistor 36 has a total emitter area selected to be in the range of about 5 μm$^2$ to about 10 μm$^2$. For example, the NPN bipolar transistor 36 can have an emitter composed of four stripes, each stripe having a width of about 0.35 μm and a length of about 20 μm.

The current amplification block 32 can be configured to receive the current and to amplify the current $I_1$ to generate the current $I_2$. The current amplification block 32 can include n gain stages, such as the gain stages 37a-37c. The number of gain stages n can be selected to be in the range of, for example, about 1 to about 10. Other numbers will be readily determined by one of ordinary skill in the art. In bipolar transistor embodiments, the number of gain stages can be selected based on, for example, the common-emitter gain, or beta, and the cut-off frequency Ft of the bipolar transistors. Various embodiments of the current amplification block 32 will be described below with reference to FIGS. 4A-4E.

The clamp block 33 includes a PNP bipolar transistor 38 having an emitter, a base, and a collector. The emitter of the PNP bipolar transistor 38 is electrically connected to the node $N_1$, and the collector of the PNP bipolar transistor 38 is electrically connected to the node $N_2$. The base of the PNP bipolar transistor 38 is configured to receive the current $I_2$ from the current amplification block 32. In response to the current $I_2$, the clamp block 33 can be configured to transition from a high-impedance state to a low-impedance state, thereby opening a current path between the first and second nodes $N_1$ and $N_2$ and providing protection from a transient electrical event. In one embodiment, the PNP bipolar transistor 38 has a total emitter area selected to be in the range of, for example, about 300 μm$^2$ to about 3000 μm$^2$. Other emitter areas will be readily determined by one of ordinary skill in the art. For example, the PNP bipolar transistor 38 can include five bipolar devices operating in parallel, each device have an emitter composed of four stripes, each stripe having a width of about 1 μm and a length of about 20 μm.

Figure 4A:
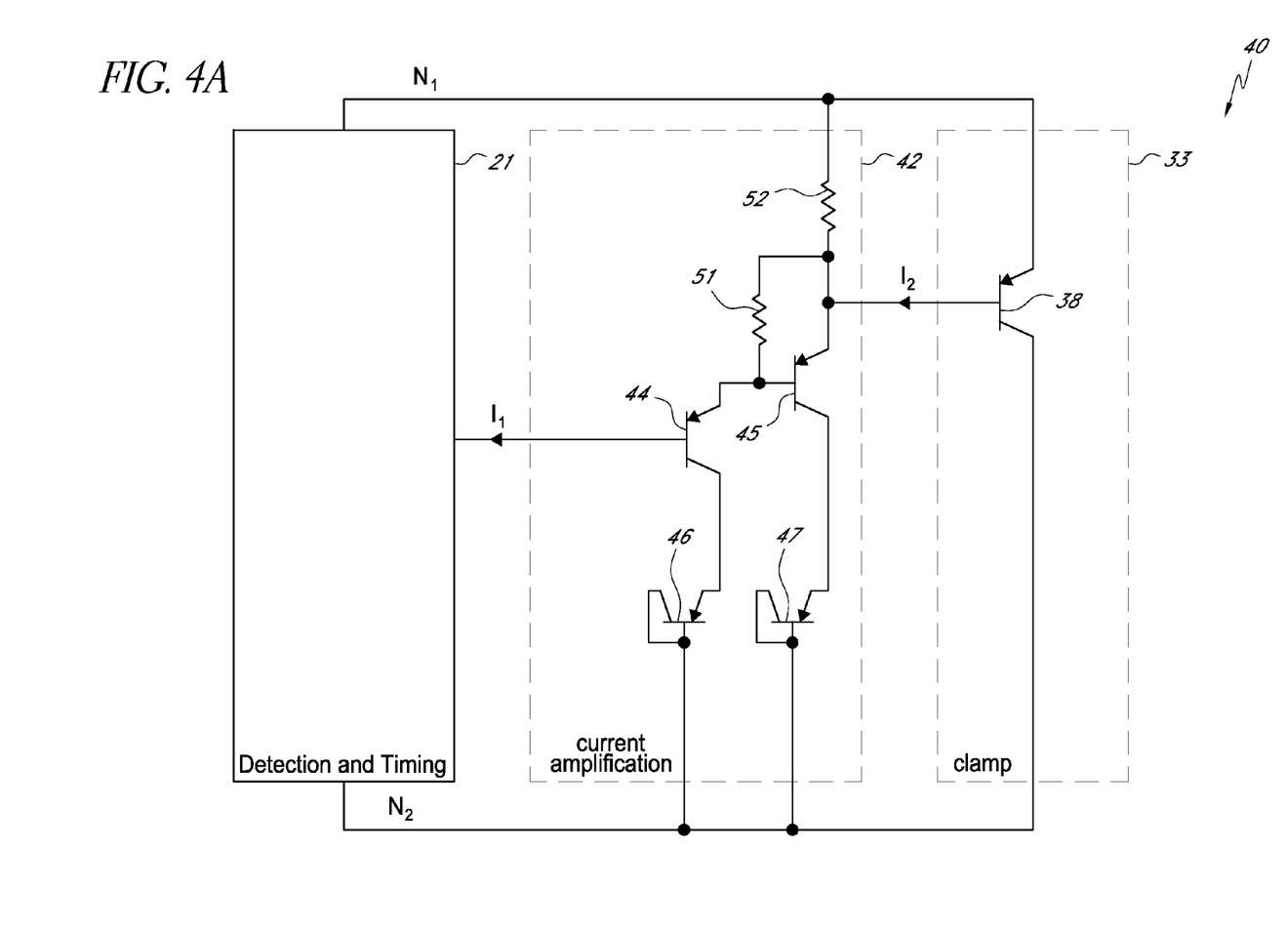
FIG. 4A is a circuit diagram illustrating an actively-controlled protection circuit in accordance with another embodiment.

FIG. 4A is a circuit diagram illustrating an actively-controlled protection circuit 40 in accordance with another embodiment. The illustrated protection circuit 40 includes a detection and timing block 21, a current amplification block 42, and a clamp block 33. As shown in FIG. 4A, the detection and timing block 21, the current amplification block 42, and the clamp block 33 are each electrically connected between the first node $N_1$ and the second node $N_2$.

The clamp block 33 includes a PNP bipolar transistor 38 having an emitter electrically connected to the first node $N_1$ and a collector electrically connected to the second node $N_2$. The PNP bipolar transistor 38 further includes a base configured to receive the current $I_2$ from the current amplification block 42.

The detection and timing block 21 can be similar to the detection and timing block 31 of FIG. 3. However, skilled artisans will appreciate that any suitable circuit for generating a current $I_1$ for a preselected period of time in response to a transient electrical event can be employed.

The current amplification block 42 includes a first resistor 51, a second resistor 52, a first PNP bipolar transistor 44, a second PNP bipolar transistor 45, a third PNP bipolar transistor 46, and a fourth PNP bipolar transistor 47. The PNP bipolar transistors 44-47 each include an emitter, a base and a collector.

The base and collector of the third PNP bipolar transistor 46 are electrically connected to the node $N_2$, and the emitter of the third PNP bipolar transistor 46 is electrically connected to the collector of the first PNP bipolar transistor 44. The base of the first PNP bipolar transistor 44 is configured to receive the current $I_1$ from the detection and timing block 21, and the emitter of the first PNP bipolar transistor 44 is electrically connected to the base of the second bipolar transistor 45 and to a first end of the first resistor 51. The first resistor 51 further includes a second end electrically connected to the emitter of the second PNP bipolar transistor 45, to a first end of the second resistor 52 and to the base of the PNP bipolar transistor 38 of the clamp block 33. The second resistor 52 further includes a second end electrically connected to first node $N_1$. The emitter of the fourth PNP bipolar transistor 47 is electrically connected to the collector of the second PNP bipolar transistor 45, and the base and collector of the fourth PNP bipolar transistor 47 are electrically connected to the second node $N_2$.

The current amplification block 42 can receive the first current $I_1$ and can amplify the current $I_1$ to generate a second current $I_2$. For example, the first PNP bipolar transistor 44 can have a common-emitter gain, or beta, of $\beta_1$, and the second PNP bipolar transistor 45 can have a common-emitter gain of $\beta_2$. After a transient electrical event is detected, the first PNP bipolar transistor 44 can be configured to be biased in a forward-active mode, and have a base current equal to about the first current $I_1$ and an emitter current equal to about $\beta_1 * I_1$. A portion of the emitter current of the first PNP bipolar transistor 44 can be provided to the base of the second PNP bipolar transistor 45. The resistance of the first resistor 51 can be sufficiently large such that the base current of the second PNP bipolar transistor 45 is equal to about the emitter current of the first PNP bipolar transistor 44. The second PNP bipolar transistor 45 can be configured to be in a forward-active region of operation when a transient electrical event is present, and can have an emitter current substantially equal to about $\beta_2\beta_1 * I_1$. The resistance of the second resistor can be sufficiently large such that the current $I_2$ is equal to about the emitter current of the second PNP bipolar transistor 45.

The common-emitter gain of the first and second PNP bipolar transistor 44, 45 can be selected to each have a common-emitter gain of about $\beta$, such that the current gain of the current amplification block 42 is equal to about $\beta^2$. By increasing the number of gain stages of the current amplification block 42, the current gain can be increased. For example, using n bipolar transistor gain stages having a common-emitter gain equal to about $\beta$ in a forward-active configuration such as that shown in FIG. 4A, can result in a current amplification block 42 having a current gain equal to about $\beta^n$. The clamp block 33 can use the second current $I_2$ to create a low impedance condition between the emitter and the collector of the PNP bipolar transistor 38, and to discharge the current $I_{SHUNT}$ between nodes $N_1$ and $N_2$. For example, for an embodiment in which the PNP bipolar transistors 38, 44, 45 have a common-emitter gain equal to about $\beta$, the current $I_{SHUNT}$ can be about $\beta^3$ times greater than the first current $I_1$. A relatively high current gain multiplication can allow for a strong base current driving condition in the PNP bipolar transistor 38, which can enable a low impedance path for the current $I_{SHUNT}$ during an overstress event.

In one embodiment, the first PNP bipolar transistor 44 has a total emitter area selected to be in the range of about 20 $\mu m^2$ to about 50 $\mu m^2$. For example, the first PNP bipolar transistor 44 can include four stripes, each stripe having a width of about 1 $\mu m$ and a length of about 10 $\mu m$. In another embodiment, the second PNP bipolar transistor 45 has a total emitter area selected to be in the range of about 20 $\mu m^2$ to about 50 $\mu m^2$. For example, the second PNP bipolar transistor 45 can include four stripes, each stripe having a width of about 1 $\mu m$ and a length of about 10 $\mu m$.

The third and fourth PNP bipolar transistors 46, 47 can be included to reduce the leakage current of the clamp block 33. For example, the third and fourth PNP bipolar transistors 46, 47, can reduce the collector-emitter voltages of first and second PNP bipolar transistors 44, 45 when the protection circuit 40 is in an OFF state, thereby reducing the leakage current of the protection circuit 40.

Furthermore, the third and fourth PNP bipolar transistors 46, 47 can aid in retaining the charge present in the first and second PNP bipolar transistors 44, 45, respectively, which can aid in maintaining the clamp block 33 in the low-impedance state for a longer duration once a transient electrical event has been detected. In particular, the presence of the third and fourth PNP bipolar transistors 46, 47 in a diode configuration can reduce the reverse bias voltages of the collector-base junctions of first and second PNP bipolar transistors 44, 45 when biased in a forward-active mode. By reducing the reverse bias of the collector-base junction voltages in this manner, an increase of the base current resulting from the Early effect can be reduced, and the duration in which the clamp block 33 remains in a low-impedance state can be increased.

In one embodiment, the third and fourth transistors 46, 47 each have a total emitter area selected to be in the range of about 5 $\mu m^2$ to about 50 $\mu m^2$. Other emitter areas will be readily determined by one of ordinary skill in the art. For example, the third PNP bipolar transistor 46 can include four stripes, each stripe having a width of about 1 $\mu m$ and a length of about 10 $\mu m$, and the fourth PNP bipolar transistor 47 can include four stripes, each stripe having a width of about 1 $\mu m$ and a length of about 10 $\mu m$.

The first and second resistors 51, 52 can be used to aid in keeping the PNP bipolar transistors 38, 45 away from an avalanche breakdown condition. For example, skilled artisans will appreciate that the PNP bipolar transistors 38, 45 can have higher collector-emitter breakdown voltages relative to a configuration in which the impedance between the base-emitter junctions of the PNP bipolar transistors is infinite. Reducing the breakdown voltages of the PNP bipolar transistors 38, 45 can reduce leakage current of the transistors 38, 45, and can help in ensuring the protection circuit 40 reaches a low-impedance state before the PNP bipolar transistors 38, 45 enter a breakdown condition. In one embodiment, the first resistor 51 has a resistance selected to be in the range of about 1 kΩ to about 3 kΩ, and the second resistor 52 has a resistance selected to be in the range of about 2 kΩ to about 8 kΩ. Other applicable resistance values will be readily determined by one of ordinary skill in the art.

Figure 4B:
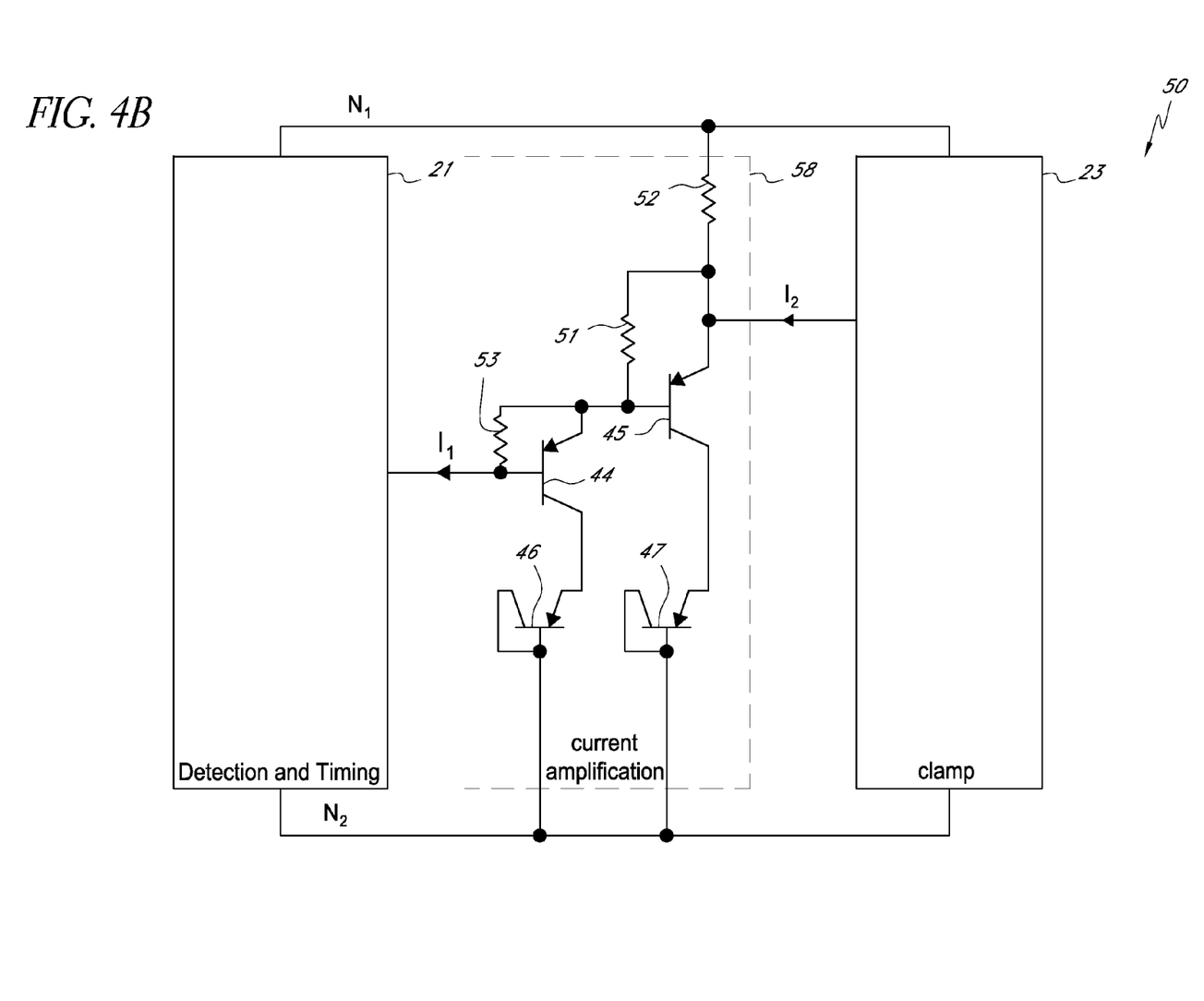
FIG. 4B is a circuit diagram illustrating an actively-controlled protection circuit in accordance with yet another embodiment.

FIG. 4B is a circuit diagram illustrating an actively-controlled protection circuit 50 in accordance with yet another embodiment. The illustrated protection circuit 50 includes a detection and timing block 21, a current amplification block 58, and a clamp block 23. As shown in FIG. 4B, the detection and timing block 21, the current amplification block 58, and the clamp block 23 are each electrically connected between the first node $N_1$ and the second node $N_2$. The detection and timing block 21 can provide the first current $I_1$ to the current amplification block 58, which in turn can provide the second current $I_2$ to the clamp block 23. The clamp block 23 and the detection and timing block 21 can be as described earlier.

The illustrated current amplification block 58 includes first and second resistors 51, 52 and PNP bipolar transistors 44-47 connected as described above with reference to FIG. 4A. Additionally, the current amplification block 58 includes the third resistor 53 having a first end electrically connected to the base of the first PNP bipolar transistor 44, and a second end electrically connected to the first end of the first resistor 51, the emitter of the first PNP bipolar transistor 44, and to the base of the second PNP bipolar transistor 45. The third resistor can increase the breakdown voltage of the first PNP bipolar transistor 44 and aid in biasing the base of PNP bipolar transistor 44 during normal operation, thereby reducing the leakage current of the transistor. In one embodiment, the third resistor 53 has a resistance selected to be in the range of about 0.5 kΩ to about 3 kΩ.

Figure 4C:
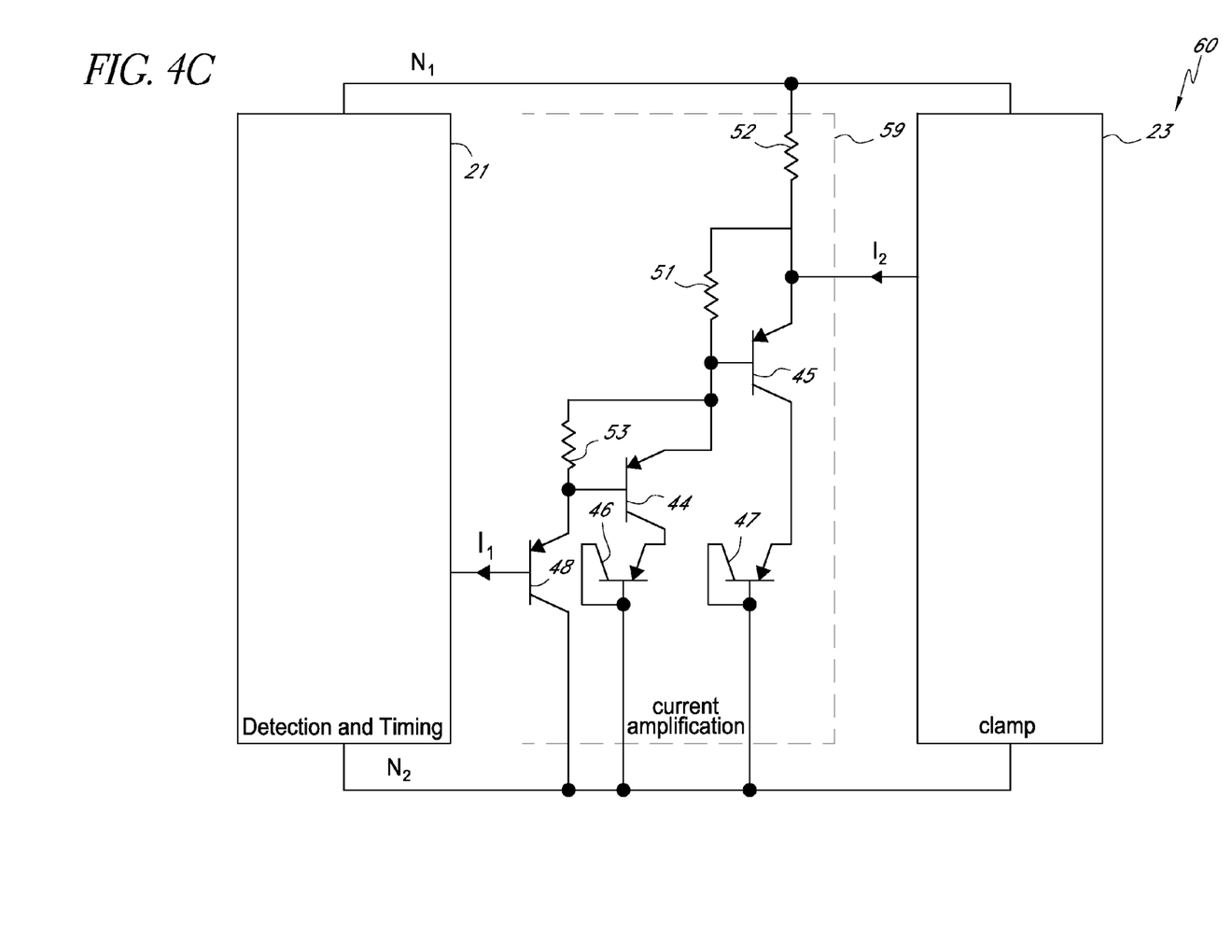
FIG. 4C is a circuit diagram illustrating an actively-controlled protection circuit in accordance with yet another embodiment.

FIG. 4C is a circuit diagram illustrating an actively-controlled protection circuit 60 in accordance with yet another embodiment. The illustrated protection circuit 60 includes a detection and timing block 21, a current amplification block 59, and a clamp block 23. The illustrated current amplification block 59 includes resistors 51-53 and PNP bipolar transistors 44-47 connected as described above with reference to FIGS. 4A-4B.

Additionally, the current amplification block 59 includes a fifth PNP bipolar transistor 48 having a collector electrically connected to the second node $N_2$, a base configured to receive the first current $I_1$, and an emitter electrically connected to the base of the first PNP bipolar transistor 44 and to the first end of the third resistor 53. Inclusion of the fifth PNP bipolar transistor 48 can increase the current gain in the current amplification block 59, which can enhance the clamping capability of the pad protection circuit, such as in an embodiment in which lower cut-off frequency bipolar devices are used. The current amplification block 59 has three PNP bipolar transistor gain stages, while the current amplification block 42 of FIG. 4A has two PNP bipolar transistor gain stages. More or fewer PNP bipolar transistor gain stages can be used to achieve the desired gain of the current amplification block. In one embodiment, the number of PNP bipolar transistor gain stages is selected to be in the range of about 1 to about 10.

Figure 4D:
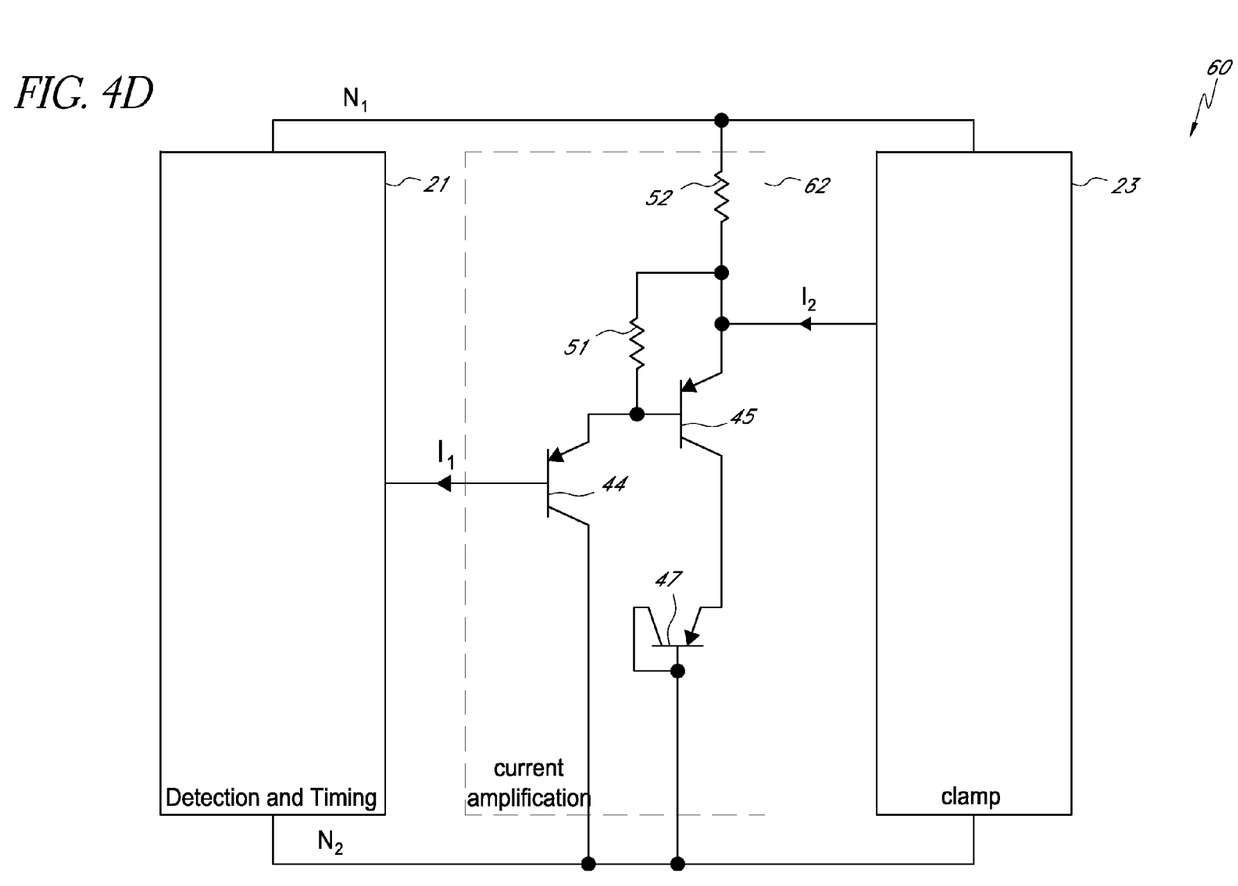
FIG. 4D is a circuit diagram illustrating an actively-controlled protection circuit in accordance with yet another embodiment.

FIG. 4D is a circuit diagram illustrating an actively-controlled protection circuit 60 in accordance with yet another embodiment. The illustrated protection circuit 60 includes a detection and timing block 21, a current amplification block 62, and a clamp block 23. The illustrated current amplification block 62 includes resistors 51-52 and PNP bipolar transistors 44, 45, 47 connected as described above with reference to FIG. 4A, except that the current amplification block 62 does not include the PNP bipolar transistor 46 connected between the collector of the first PNP bipolar transistor 44 and the second node $N_2$. Rather, the collector of the first PNP bipolar transistor 44 is electrically connected to the second node $N_2$ and the PNP bipolar transistor 46 has been removed. Removal of the PNP bipolar transistor 46 can reduce the area of the current amplification block 62, at the expense of an increase in leakage current.

Figure 4E:
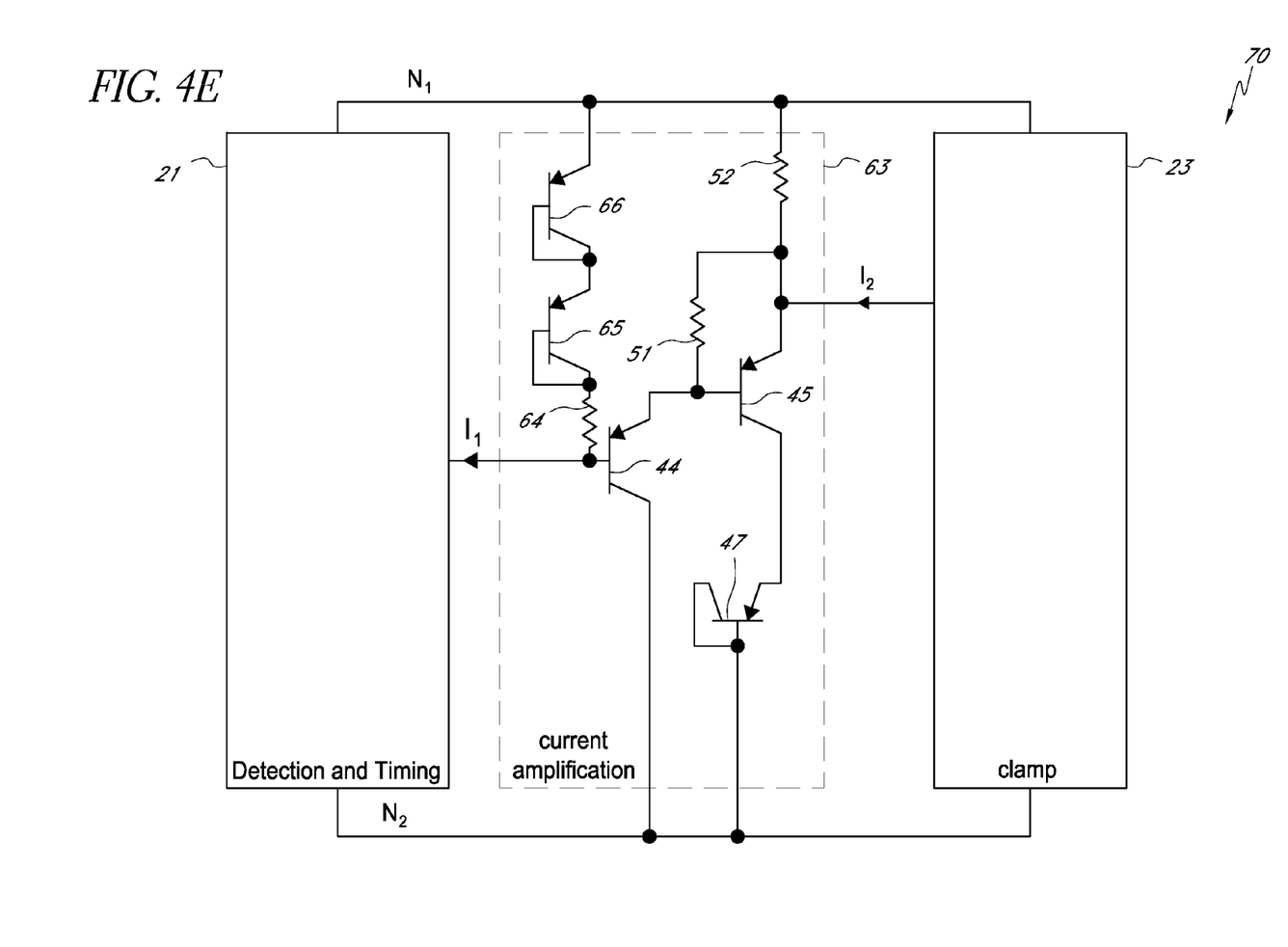
FIG. 4E is a circuit diagram illustrating an actively-controlled protection circuit in accordance with yet another embodiment.

FIG. 4E is a circuit diagram illustrating an actively-controlled protection circuit 70 in accordance with yet another embodiment. The illustrated protection circuit 70 includes a detection and timing block 21, a current amplification block 63, and a clamp block 23. The illustrated current amplification block 63 includes resistors 51-52 and PNP bipolar transistors 44, 45, 47 connected as described above with reference to FIG. 4D. Additionally, the current amplification block 63 includes a resistor 64, and PNP bipolar transistors 65, 66. The resistor 64 includes a first end electrically connected to the base of the first PNP bipolar transistor 44, and a second end electrically connected to the base and collector of the PNP bipolar transistor 65. The emitter of the PNP bipolar transistor 65 is electrically connected to the collector and base of the PNP bipolar transistor 66. The emitter of the PNP bipolar transistor 66 is electrically connected to the first node $N_1$. In one embodiment, the resistance of the resistor 64 is selected to between about 0.5 kΩ to about 3 kn. In another embodiment, the PNP bipolar transistors 65, 66 each have a total emitter area selected to be in the range of about 5 μm² to about 50 μm².

Including the resistor 64 and the PNP bipolar transistors 65, 66 can aid in biasing the base of the first PNP bipolar transistor 44 during operation while increasing the breakdown voltage of the first PNP bipolar transistor 44. For example, the inclusion of the PNP bipolar transistors 65, 65 can be used to control the voltage at the base of the first PNP bipolar transistor 44 when the current $I_1$ is initiated, while the resistor 64 can increase the breakdown voltage of first PNP bipolar transistor 44 to reduce current leakage. Furthermore, the resistor 64 can improve stability by cancelling signals coupled to the base of transistor 44 at relatively high speeds, such as speeds greater than about 5 Ghz.

Figure 5A:
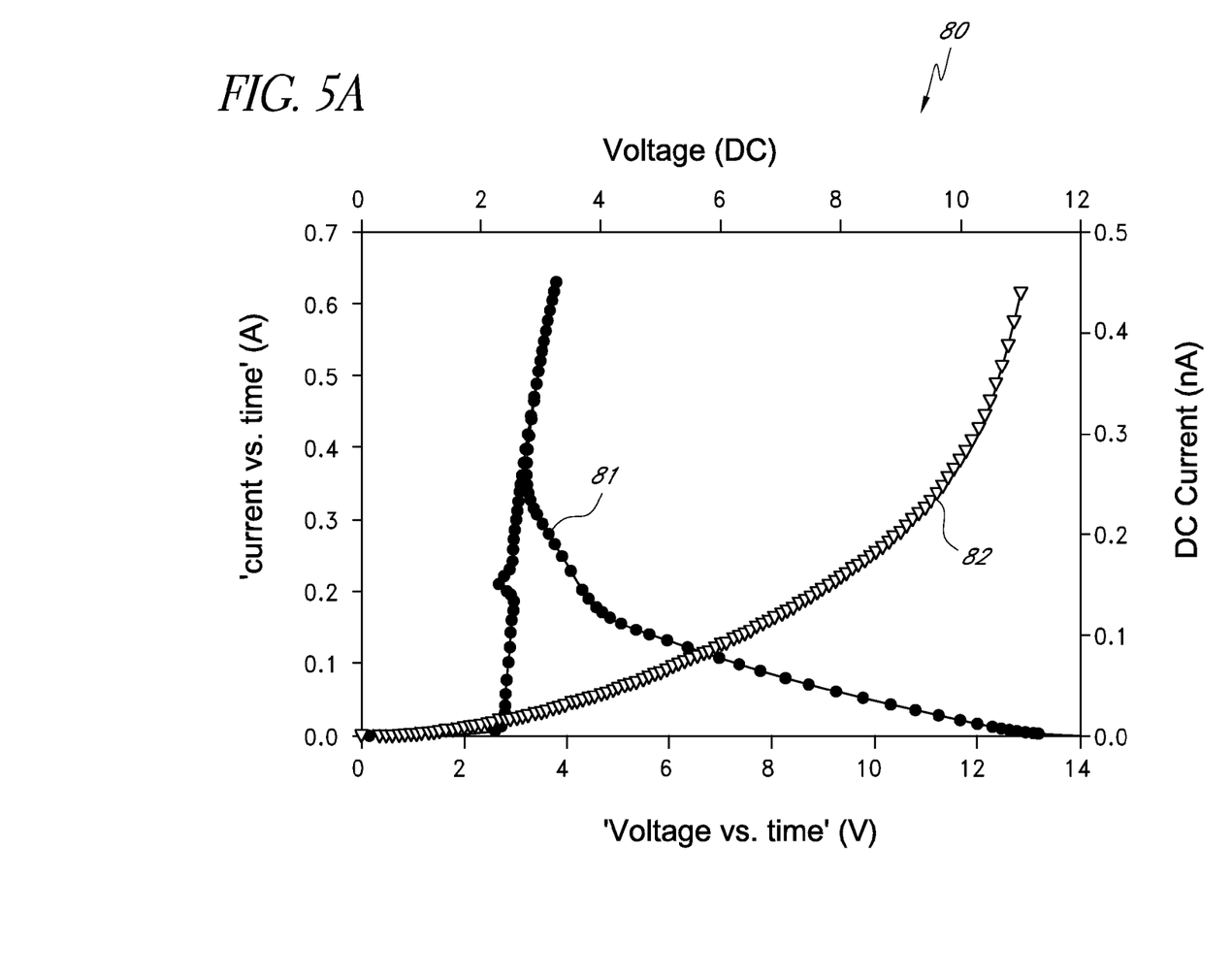
FIG. 5A is a graph of clamp voltage versus clamp current for one example of a pad protection circuit.

FIG. 5A is a transient and DC SPICE simulation of clamp voltage versus clamp current for one example of a pad protection circuit, such as the pad protection circuit 40 of FIG. 4A optimized for about a 10 V process. The illustrated graph 80 includes a plot 81 of transient clamp voltage versus transient clamp current and a plot 82 of DC clamp voltage versus DC clamp current.

The plot 81 illustrates the operation of the pad protection circuit during a 1000 V Human-Body-Model (HBM) ESD impulse over a 1 μs duration. The pad protection circuit can be connected between a pad receiving the ESD impulse and a ground node, and each point on the plot 81 can correspond to a measurement of the current through the pad protection circuit and the voltage between the pad and the ground node during the 1 μs simulation. As shown in the plot 81, the simulated transient voltage across the pad can be maintained less than about 5 V at a peak current of about 660 mA, which can correspond to the maximum current of a 1000 V HBM transient ESD impulse.

The plot 82 illustrates the leakage current of the pad protection circuit as a function of the voltage across the pad protection circuit. As shown in FIG. 5A, the leakage current of the pad protection circuit can be about 300 pA when operating at 10V.

Figure 5B:
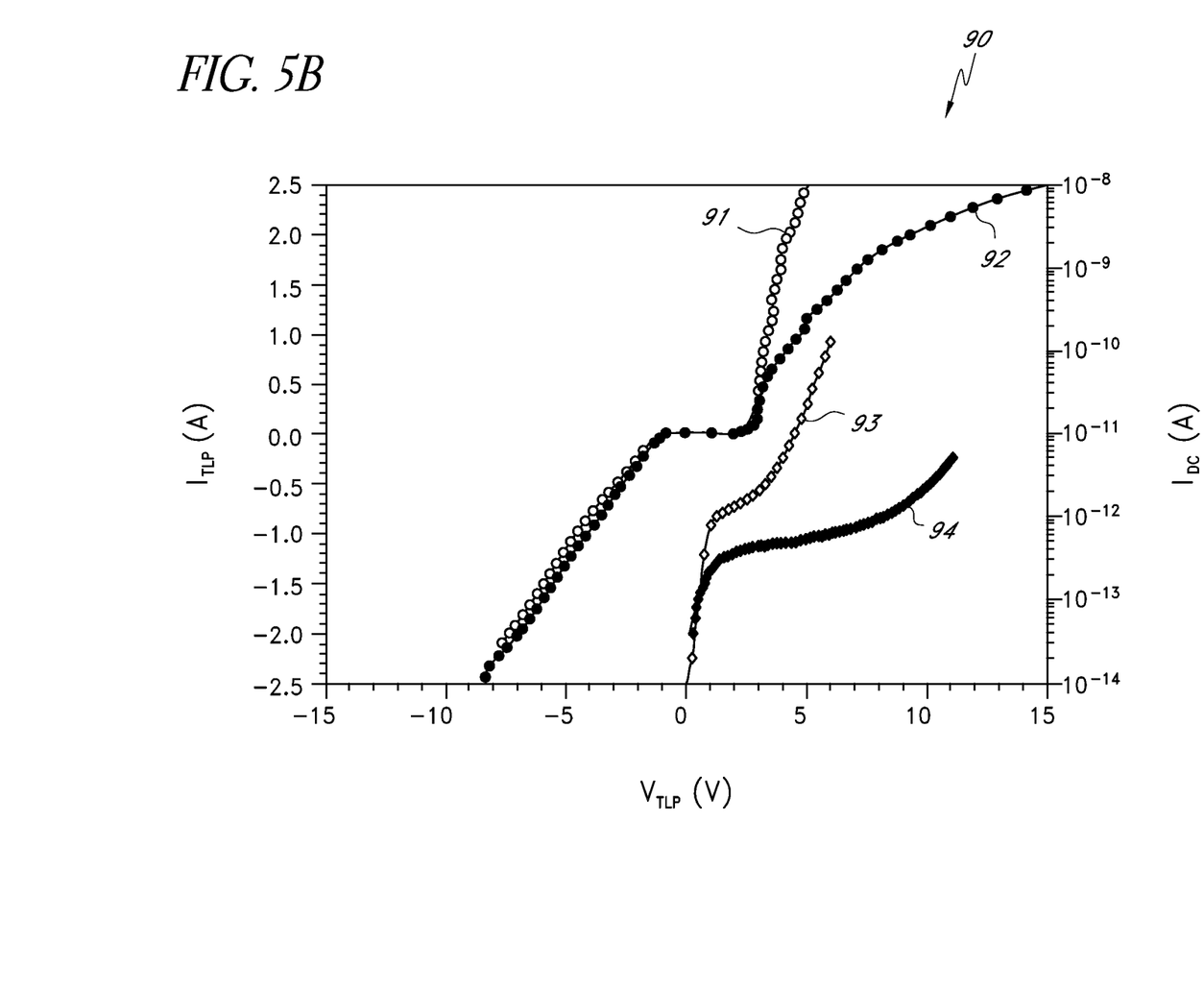
FIG. 5B is a graph of clamp voltage versus clamp current for two examples of pad protection circuits.

FIG. 5B is a graph 90 of transient clamp voltage versus transient clamp current and DC current versus DC voltage for two examples of pad protection circuits. The illustrated graph 90 includes plots 91, 92 of transmission line pulsing (TLP) laboratory data, and the plots 93, 94 of laboratory data for DC voltage versus DC leakage current for the two examples of pad protection circuits. The plots 91, 93 can correspond to the pad protection circuit 40 of FIG. 4A optimized for about a 5 V process in combination with a diode for negative transient electrical event protection, and the plots 92, 94 can correspond to the pad protection circuit 40 of FIG. 4A optimized for about a 10 V process in combination with a diode for negative transient electrical event protection. As shown in plots 91, 92, the pad protection circuit can provide protection from transient electrical events, and a diode can provide protection from negative transient electrical events.

The plot 91 illustrates TLP laboratory data obtained from wafers for one embodiment of a pad protection circuit. Each TLP measurement point of the plot 91 corresponds to a voltage and a current measurement obtained by forcing a rectangular 100 ns current pulse into the pad protection circuit and measuring the voltage of the pad protection circuit between about 40 ns and 70 ns. As shown in FIG. 5B, the pad protection circuit corresponding to plot 91 can be suitable, for example, for about a 5 V process. As shown in plot 91, the pad protection circuit can trigger between about 2.9 V and about 3.2 V. Skilled artisans will appreciate that the turn-on voltage of the pad protection circuit can be varied by selecting the number of gain stages of the pad protection circuit. For example, if PNP bipolar transistors were used in the gain stages 37a-37c of the protection circuit 30 of FIG. 3, the NPN bipolar transistor 36, the PNP bipolar transistor 38, and each gain stage 37a-37c may each increase the turn-on voltage by roughly 0.7 V.

The plot 92 illustrates TLP laboratory data obtained from wafers for another embodiment of a pad protection circuit. As shown in FIG. 5B, the pad protection circuit of plot 92 can be suitable, for example, for about a 10 V process.

The plot 93 illustrates a plot of DC voltage versus leakage current for the pad protection circuit corresponding to the plot 91. The plot 94 illustrates a plot of DC voltage versus leakage current for the pad protection circuit corresponding to the plot 92.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, base stations, communication modems, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus for providing transient electrical event protection, the apparatus comprising:
 a detection and timing circuit configured to detect a presence or absence of a transient electrical event at a first node, wherein the detection and timing circuit is further configured to generate a first current for a first duration upon detection of the transient electrical event;
 a current amplification circuit configured to receive the first current from the detection and timing circuit and to amplify the first current to generate a second current, the current amplification circuit comprising;
  a first bipolar transistor having an emitter, a base, and a collector, wherein the first bipolar transistor is configured to receive at least a portion of the first current or configured to generate at least a portion of the second current; and
  a second bipolar transistor having an emitter, a base, and a collector, wherein the emitter of the second bipolar transistor is electrically connected to the collector of the first bipolar transistor, and wherein the collector of the second bipolar transistor is electrically connected to the base of the second bipolar transistor and to a second node; and
 a clamping circuit electrically connected between the first node and the second node and configured to receive the second current for activation, wherein the clamping circuit is configured to activate a low impedance path between the first and second nodes in response to the second current, and to otherwise deactivate the low impedance path.

2. The apparatus of claim 1, wherein the clamping circuit comprises a PNP bipolar clamping transistor having an emitter, a base, and a collector, wherein the emitter is electrically connected to the first node and the collector is electrically connected to the second node, and wherein the base is configured to receive the second current.

3. The apparatus of claim 2, wherein the detection and timing circuit and the current amplification circuit are configured to provide the second current to activate the low impedance path before a junction breakdown of the PNP bipolar clamping transistor.

4. The apparatus of claim 2, wherein the current amplification circuit comprises at least two gain stages.

5. The apparatus of claim 4, wherein the current amplification gain stages comprise bipolar transistor gain stages.

6. The apparatus of claim 1, wherein the current amplification circuit comprises two or more PNP bipolar transistors.

7. The apparatus of claim 6, wherein the first bipolar transistor is a first PNP bipolar transistor, wherein the second bipolar transistor is a second PNP bipolar transistor, wherein the current amplification circuit further comprises a third PNP bipolar transistor, and wherein the third PNP bipolar transistor includes an emitter, a base, and a collector, and wherein the base of the third PNP bipolar transistor is configured to receive at least a portion of the first current and the emitter of the first PNP bipolar transistor is configured to generate the second current, and wherein the emitter of the third PNP bipolar transistor is electrically connected to the base of the first PNP bipolar transistor.

8. An apparatus for providing transient electrical event protection, the apparatus comprising:
- a detection and timing circuit configured to detect a presence or absence of a transient electrical event at a first node, wherein the detection and timing circuit is further configured to generate a first current for a first duration upon detection of the transient electrical event;
- a current amplification circuit configured to receive the first current from the detection and timing circuit and to amplify the first current to generate a second current, wherein the current amplification circuit comprises two or more PNP bipolar transistors, and wherein the current amplification circuit comprises a first PNP bipolar transistor and a second PNP bipolar transistor, and wherein the first and second PNP bipolar transistors each include an emitter, a base, and a collector, and wherein the base of the first PNP bipolar transistor is configured to receive at least a portion of the first current and the emitter of the second PNP transistor is configured to generate at least a portion of the second current, and wherein the emitter of the first PNP transistor is electrically connected to the base of the second PNP transistor;
- a clamping circuit electrically connected between the first node and a second node and configured to receive the second current for activation, wherein the clamping circuit is configured to activate a low impedance path between the first and second nodes in response to the second current, and to otherwise deactivate the low impedance path; and
- a first resistor having a first end and a second end, wherein the first end of the first resistor is electrically connected to the emitter of the first PNP transistor and to the base of the second PNP transistor, and wherein the second end is electrically connected to the emitter of the second PNP transistor.

9. An apparatus for providing transient electrical event protection, the apparatus comprising:
- a detection and timing circuit configured to detect a presence or absence of a transient electrical event at a first node, wherein the detection and timing circuit is further configured to generate a first current for a first duration upon detection of the transient electrical event;
- a current amplification circuit configured to receive the first current from the detection and timing circuit and to amplify the first current to generate a second current, wherein the current amplification circuit comprises two or more PNP bipolar transistors, and wherein the current amplification circuit comprises a first PNP bipolar transistor and a second PNP bipolar transistor, and wherein the first and second PNP bipolar transistors each include an emitter, a base, and a collector, and wherein the base of the first PNP bipolar transistor is configured to receive at least a portion of the first current and the emitter of the second PNP transistor is configured to generate at least a portion of the second current, and wherein the emitter of the first PNP transistor is electrically connected to the base of the second PNP transistor;
- a clamping circuit electrically connected between the first node and a second node and configured to receive the second current for activation, wherein the clamping circuit is configured to activate a low impedance path between the first and second nodes in response to the second current, and to otherwise deactivate the low impedance path;
- a first resistor having a first end and a second end, wherein the first end of the first resistor is electrically connected to the emitter of the first PNP transistor and to the base of the second PNP transistor, and wherein the second end is electrically connected to the emitter of the second PNP transistor; and
- a second resistor having a first end and a second end, wherein the first end of the second resistor is electrically connected to the emitter of the second PNP transistor and to the second end of the first resistor, and wherein the second end of the second resistor is electrically connected to the first node.

10. The apparatus of claim 9, further comprising a third PNP bipolar transistor having an emitter, a base, and a collector, wherein the emitter of the third PNP bipolar transistor is electrically connected to the base of the first PNP bipolar transistor, and wherein the collector of the third PNP bipolar transistor is electrically connected to the second node, and wherein the base of the third PNP bipolar transistor is configured to receive at least a portion of the first current.

11. The apparatus of claim 10, further comprising a third resistor having a first end and a second end, wherein the first end is electrically connected to base of the first PNP bipolar transistor and to the emitter of the third PNP bipolar transistor, and wherein the second end is electrically connected to the first end of the first resistor, to the base of the second PNP bipolar transistor, and to the emitter of the first PNP bipolar transistor.

12. An apparatus for providing transient electrical event protection, the apparatus comprising:
- a detection and timing circuit configured to detect a presence or absence of a transient electrical event at a first node, wherein the detection and timing circuit is further configured to generate a first current for a first duration upon detection of the transient electrical event;
- a current amplification circuit configured to receive the first current from the detection and timing circuit and to amplify the first current to generate a second current, wherein the current amplification circuit comprises two or more PNP bipolar transistors, and wherein the current amplification circuit comprises a first PNP bipolar transistor and a second PNP bipolar transistor, and wherein the first and second PNP bipolar transistors each include an emitter, a base, and a collector, and wherein the base of the first PNP bipolar transistor is configured to receive at least a portion of the first current and the emitter of the second PNP transistor is configured to generate at least a portion of the second current, and wherein the emitter of the first PNP transistor is electrically connected to the base of the second PNP transistor;
- a clamping circuit electrically connected between the first node and a second node and configured to receive the second current for activation, wherein the clamping circuit is configured to activate a low impedance path between the first and second nodes in response to the second current, and to otherwise deactivate the low impedance path;

a first resistor having a first end and a second end, wherein the first end of the first resistor is electrically connected to the emitter of the first PNP transistor and to the base of the second PNP transistor, and wherein the second end is electrically connected to the emitter of the second PNP transistor;

a second resistor having a first end and a second end, wherein the first end of the second resistor is electrically connected to the emitter of the second PNP transistor and to the second end of the first resistor, and wherein the second end of the second resistor is electrically connected to the first node; and a biasing resistor, a first biasing transistor and a second biasing transistor, wherein the first and second biasing transistors are each PNP bipolar transistors having an emitter, a base, and a collector, and wherein the biasing resistor includes a first end electrically connected to the base of the first PNP bipolar transistor and a second end electrically connected to the collector and base of the first biasing transistor, and wherein the emitter of the first biasing transistor is electrically connected to the collector and base of the second biasing transistor, and wherein the emitter of the second biasing transistor is electrically connected to the first node.

13. An apparatus for providing transient electrical event protection, the apparatus comprising:

a detection and timing circuit configured to detect a presence or absence of a transient electrical event at a first node, wherein the detection and timing circuit is further configured to generate a first current for a first duration upon detection of the transient electrical event;

a current amplification circuit configured to receive the first current from the detection and timing circuit and to amplify the first current to generate a second current, wherein the current amplification circuit comprises two or more PNP bipolar transistors, and wherein the current amplification circuit comprises a first PNP bipolar transistor and a second PNP bipolar transistor, and wherein the first and second PNP bipolar transistors each include an emitter, a base, and a collector, and wherein the base of the first PNP bipolar transistor is configured to receive at least a portion of the first current and the emitter of the second PNP transistor is configured to generate at least a portion of the second current, and wherein the emitter of the first PNP transistor is electrically connected to the base of the second PNP transistor;

a clamping circuit electrically connected between the first node and a second node and configured to receive the second current for activation, wherein the clamping circuit is configured to activate a low impedance path between the first and second nodes in response to the second current, and to otherwise deactivate the low impedance path; and a third PNP bipolar transistor having an emitter, a base, and a collector, wherein the emitter of the third PNP bipolar transistor is electrically connected to the collector of the second PNP bipolar transistor, and wherein the collector of the third PNP bipolar transistor is electrically connected to the base of the third PNP bipolar transistor and to the second node.

14. The apparatus of claim 13, further comprising a fourth PNP bipolar transistor having an emitter, a base, and a collector, wherein the emitter of the fourth PNP bipolar transistor is electrically connected to the collector of the first PNP bipolar transistor, and wherein the collector of the fourth PNP bipolar transistor is electrically connected to the base of the fourth PNP bipolar transistor and to the second node.

15. The apparatus of claim 1,
wherein the detection and timing circuit comprises a resistor, a capacitor, and an NPN bipolar transistor having an emitter, a base, and a collector, wherein the capacitor has a first terminal electrically connected to the first node and a second terminal electrically connected to the base of the NPN bipolar transistor, and wherein the first resistor has a first end electrically connected to the second terminal of the capacitor and to the base of the NPN bipolar transistor, and wherein the first resistor has a second end electrically connected to the second node, and wherein the emitter of the NPN bipolar transistor is electrically connected to the second node and the collector of the NPN bipolar transistor is configured to generate the first current.

16. The apparatus of claim 1, wherein the apparatus comprises an integrated circuit.

17. The apparatus of claim 16, further comprising a circuit to be protected of the integrated circuit, wherein the circuit to be protected is electrically connected between the first and second nodes.

18. The apparatus of claim 1,
wherein the clamping circuit comprises a PNP bipolar clamping transistor having an emitter electrically connected to the first node, a collector electrically connected to the second node, and a base configured to receive at least a portion of the second current;
wherein the base of the first bipolar transistor is configured to receive at least a portion of the first current and an emitter configured to generate the second current; and
wherein the detection and timing circuit comprises a resistor, a capacitor, and an NPN bipolar transistor having an emitter, a base, and a collector, wherein the capacitor has a first terminal electrically connected to the first node and a second terminal electrically connected to the base of the NPN bipolar transistor, wherein the first resistor has a first end electrically connected to the second terminal of the capacitor and to the base of the NPN bipolar transistor and a second end electrically connected to the second node, and wherein the emitter of the NPN bipolar transistor is electrically connected to the second node and the collector of the NPN bipolar transistor is configured to generate the first current.

19. An apparatus for providing transient electrical event protection, the apparatus comprising:

means for detecting a presence or absence of a transient electrical event at a first node and for generating a first current for a first duration upon detection of the transient electrical event;

means for amplifying the first current to generate a second current and for retaining a charge to increase the duration, the amplifying means including a bipolar transistor;

means for activating a low impedance path between the first node and a second node in response to the second current, wherein the low impedance path is otherwise deactivated; and means for reducing a collector-emitter voltage of the bipolar transistor of the amplifying means when the low impedance path is deactivated to reduce leakage current.

20. A method for providing transient electrical event protection, the method comprising:

detecting the presence of a transient electrical event at a first node;

generating a first current for a first duration in response to the transient electrical event;

amplifying the first current to generate a second current, wherein amplifying comprises:

using a first bipolar transistor to receive at least a portion of the first current or to generate at least a portion of the second current; and using a second bipolar transistor in a diode configuration to reduce a reverse bias voltage of a collector-base junction of the first bipolar transistor when the first bipolar transistor is biased in a forward-active mode; and activating a low impedance path between the first node and a second node for a current in response to the second current using a third bipolar transistor, and otherwise deactivating the low impedance path between the first and second nodes, wherein detecting, amplifying, and providing are performed by separate circuits within an integrated circuit, and wherein providing a low impedance path between the first and second nodes is performed before a junction breakdown of the third bipolar transistor.

21. The method of claim 20, wherein amplifying the first current to generate the second current comprises using at least one PNP bipolar transistor gain stage to amplify the first current.

22. A method for providing transient electrical event protection, the method comprising:

detecting the presence of a transient electrical event at a first node;

generating a first current for a first duration in response to the transient electrical event;

amplifying the first current to generate a second current, wherein amplifying the first current to generate the second current comprises using at least one PNP bipolar transistor gain stage to amplify the first current;

activating a low impedance path between the first node and a second node for a current in response to the second current using a bipolar transistor, and otherwise deactivating the low impedance path between the first and second nodes, wherein detecting, amplifying, and providing are performed by separate circuits within an integrated circuit, and wherein providing a low impedance path between the first and second nodes is performed before a junction breakdown of the bipolar transistor; and using a resistor to increase a collector-emitter breakdown voltage of a PNP bipolar transistor of the at least one PNP bipolar transistor gain stage.

23. The method of claim 20, wherein detecting the presence of the transient electrical event comprises determining if a transient electrical signal has a rate of current change ranging between about 10 mA/ns to about 1 A/ns for a length of time ranging between about 2 ns to about 500 ns.

24. The method of claim 20, wherein the third bipolar transistor is a PNP bipolar transistor, wherein activating the low impedance path comprises receiving at least a portion of the second current into a base of the PNP bipolar transistor and activating a low impedance path between a collector and an emitter of the PNP bipolar transistor.

25. A method for providing transient electrical event protection, the method comprising:

detecting the presence of a transient electrical event at a first node;

generating a first current for a first duration in response to the transient electrical event;

amplifying the first current to generate a second current;

activating a low impedance path between the first node and a second node for a current in response to the second current using a bipolar transistor, and otherwise deactivating the low impedance path between the first and second nodes, wherein detecting, amplifying, and providing are performed by separate circuits within an integrated circuit, and wherein providing a low impedance path between the first and second nodes is performed before a junction breakdown of the bipolar transistor, wherein activating the low impedance path comprises receiving at least a portion of the second current into a base of a PNP bipolar transistor and activating a low impedance path between a collector and an emitter of the PNP bipolar transistor; and using a resistor to increase the collector-emitter breakdown voltage of the PNP bipolar transistor.

26. The method of claim 20, wherein activating the low impedance path comprises providing a relatively low voltage drop between the first node and the second node.

* * * * *